US006563124B2

(12) United States Patent
Veneklasen et al.

(10) Patent No.: US 6,563,124 B2
(45) Date of Patent: May 13, 2003

(54) ELECTRON BEAM APPARATUS HAVING TRAVERSING CIRCUIT BOARDS

(75) Inventors: Lee Veneklasen, deceased, late of Castro Valley, CA (US), by Mary Veneklasen, legal representative; Vidhya Krishnamurthi, Los Altos, CA (US); Gil Winograd, Aliso Viejo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 63 days.

(21) Appl. No.: 09/814,373

(22) Filed: Mar. 21, 2001

(65) Prior Publication Data

US 2002/0134912 A1 Sep. 26, 2002

(51) Int. Cl.[7] .............................................. H01J 37/06
(52) U.S. Cl. .................................. 250/492.2; 250/398
(58) Field of Search ............................ 250/492.2, 397, 250/398

(56) References Cited

U.S. PATENT DOCUMENTS

| 5,025,114 A | 6/1991 | Braden |
| 5,393,931 A | 2/1995 | Guenther |
| 5,412,211 A | * 5/1995 | Knowles ..................... 250/310 |

OTHER PUBLICATIONS

Winograd, G.I., L.Han, M.A. McCord, and R.F.W. Please, "Multiplexed blanker array for parallel electron beam lithography", J. Vac. Sci. Technol. B 16(6), Nov./Dec. 1998.

* cited by examiner

Primary Examiner—Scott J. Sugarman
Assistant Examiner—Richard Hanig
(74) Attorney, Agent, or Firm—Janah & Associates, P.C.

(57) ABSTRACT

An electron beam apparatus is capable of registering an image on a substrate. The apparatus comprises a vacuum chamber having a wall. Electron beam source, modulator, and detector components are adapted to generate, modulate and detect an array of electron beams in the vacuum chamber. A circuit board passing through the wall of the vacuum chamber has a plurality of electrical traces to connect to the electron beam source, modulator, and detector components.

21 Claims, 5 Drawing Sheets

ELECTRON BEAM APPARATUS HAVING TRAVERSING CIRCUIT BOARDS

BACKGROUND

The present invention relates to an electron beam apparatus for projecting electron beams on a substrate.

An electron beam apparatus 100 may be used to project electron beams 135 on a substrate 130, as for example shown in FIG. 1, to generate an image comprising an electron pattern on a resist coated substrate 130. A multiple electron beam apparatus 100 comprises a chamber 110, a support 120 capable of supporting a substrate 130 in the chamber 110, electron beam source, modulating and scanning components 150 mounted on boards 140 in the chamber 110, and a vacuum pump 115 to evacuate and maintain a vacuum environment in the chamber 110. The electron beam source, modulating and scanning components 150 generate, modulate and scan an array of electron beams across the substrate 130.

An apparatus 100 that generates and modulates a few tens of individual electron beams 135 may require hundreds or even thousands of separate electrical wires 170 to electrically connect the components 150 to circuitry outside the chamber 110. Conventional apparatus 100 uses individual electrical wires 170 passing through vacuum feedthroughs 160 in a chamber wall 112 to connect to the components 150. However, the large number of electrical wires 170 passing through the vacuum feedthroughs 160 often renders the vacuum feedthroughs 160 susceptible to leakage. In addition, the complexity of the vacuum feedthroughs 160 and electrical wires 170 may make it difficult to change or modify the components 150, for example, when redesigning or adapting the electron beams for different tasks, without extensive modification of the wiring assemblies and feedthroughs 160. Also, the closely packed individual wires 170 in the feedthrough 160 may result in electromagnetic interference that causes unacceptable modulation of the electron beams 135.

Thus, it is desirable to have an electron beam apparatus having low leakage connections to the external environment. It may also be desirable to have an electron beam apparatus with an electrical connection system that is readily adapted to accommodate new circuitry without extensive modification. It is also desirable to reduce the electromagnetic interference that occurs in the electrical connection system.

SUMMARY

An electron beam apparatus that is capable of registering an electron beam pattern on a substrate comprises a vacuum chamber having a wall, a substrate support in the vacuum chamber, electron beam source components to generate an array of electron beams in the vacuum chamber, electron beam modulator components to modulate the electron beams in the vacuum chamber, electron beam detector components to detect the electron beams in the vacuum chamber, one or more circuit boards passing through the wall of the vacuum chamber, each circuit board comprising (i) an internal portion to support one or more of the electron beam source, modulator or detector components, (ii) an external portion outside the vacuum chamber to support one or more external components, and (iii) a plurality of electrical traces that extend from the internal portion to the external portion to electrically connect the electron beam source, modulator or detector components to the external components, and one or more of the external components mounted on the external portions of the circuit boards.

In another aspect, the electron beam apparatus comprises a vacuum chamber having a wall with a first feature, a substrate support in the vacuum chamber, electron beam source components to generate an array of electron beams in the vacuum chamber, electron beam modulator components to modulate the electron beams in the vacuum chamber, electron beam detector components to detect the electron beams in the vacuum chamber, one or more circuit boards passing through the wall of the vacuum chamber, each circuit board comprising (i) an internal portion to support one or more of the electron beam source, modulator or detector components, (ii) an external portion outside the vacuum chamber to support one or more external components, (iii) a plurality of electrical traces that extend from the internal portion to the external portion to electrically connect the electron beam source, modulator or detector components to the external components, and (iv) a second feature that may be fitted to the first feature in the chamber wall to align the circuit board in the vacuum chamber, and one or more of the external components mounted on the external portions of the circuit boards.

In another aspect, the electron beam apparatus comprises a vacuum chamber having a wall, a substrate support in the vacuum chamber, electron beam source components to generate an array of electron beams in the vacuum chamber, electron beam modulator components to modulate the electron beams in the vacuum chamber, the electron beam modulator components comprising an array of beam blanking components, electron beam detector components to detect the electron beams in the vacuum chamber, and a circuit board passing through the wall of the vacuum chamber, the circuit board comprising (i) an internal portion to support the array of beam blanking components, (ii) an external portion outside the vacuum chamber, and (iii) a plurality of electrical traces that extend from the internal portion to the external portion.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

Figure 1:
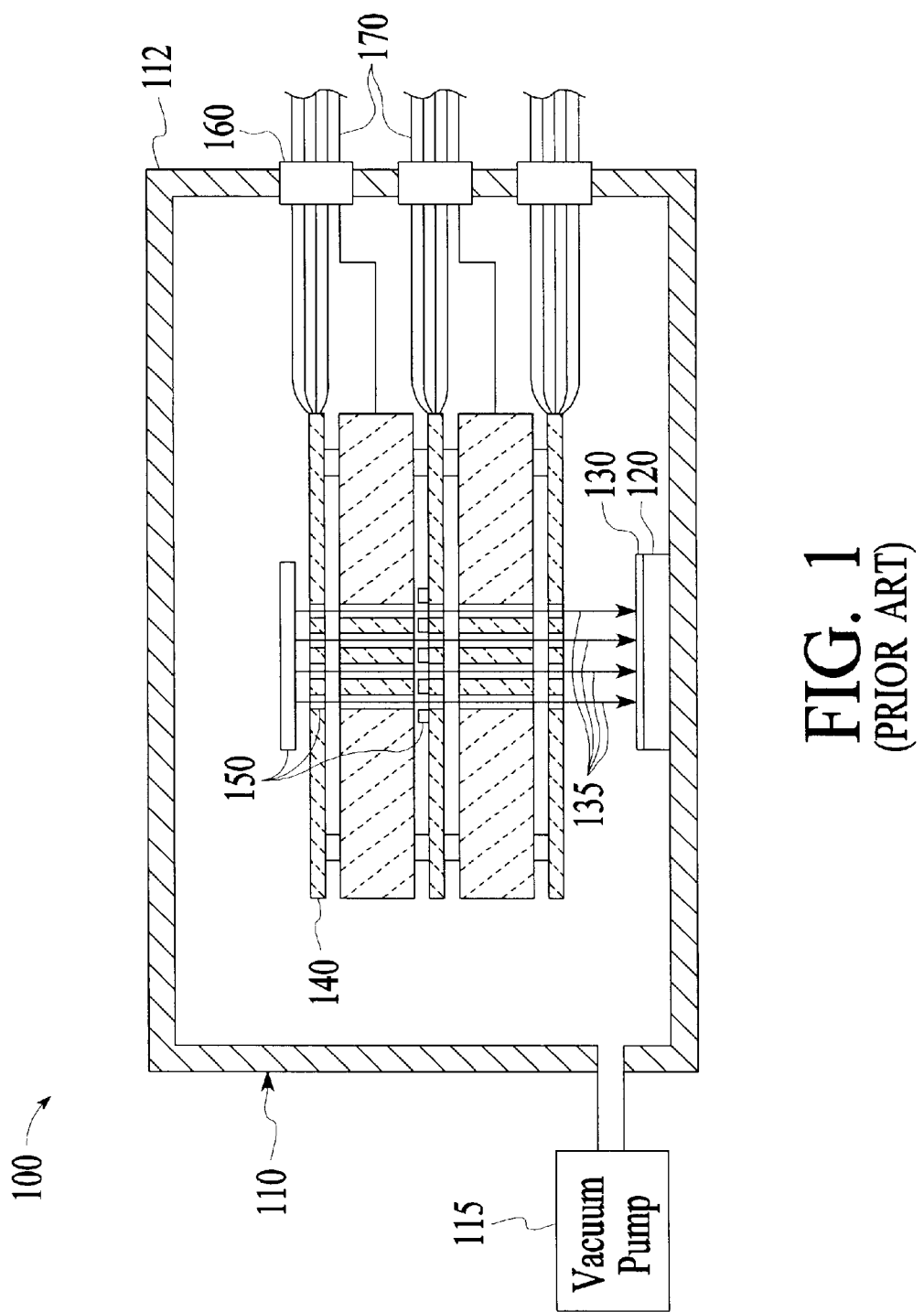
FIG. 1 (prior art) is a schematic side view of a conventional electron beam apparatus showing electrical wires passing through vacuum feedthroughs.
Figure 2:
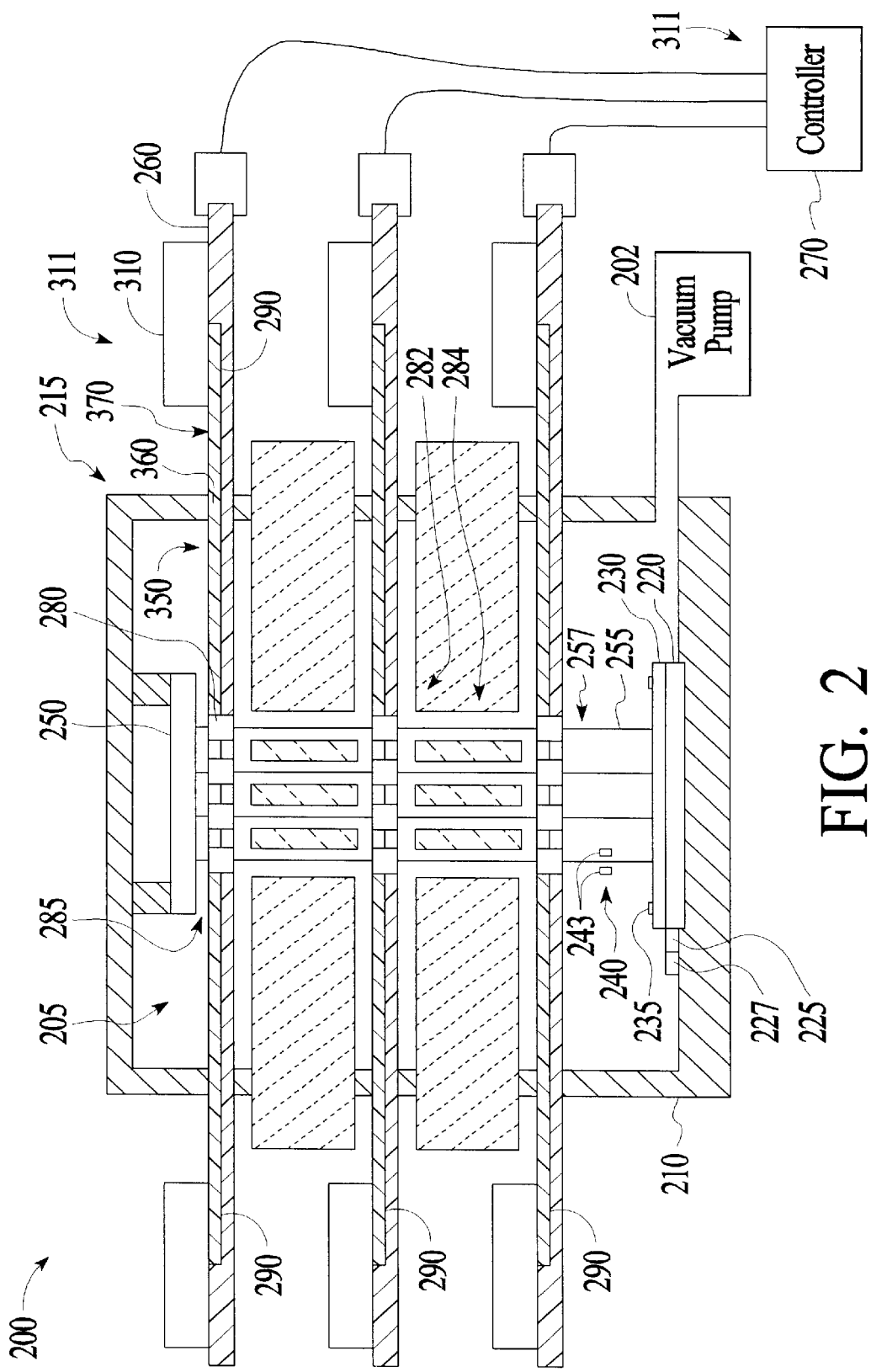
FIG. 2 is a schematic side view of an embodiment of an electron beam apparatus according to the present invention having circuit boards passing through a wall of a chamber.

An embodiment of an electron beam apparatus 200 capable of registering an electron pattern on a substrate 230 is illustrated in FIG. 2. The electron beam pattern may comprise a pattern of electronic circuitry, such as for example, an integrated circuit or printed circuit board design. The substrate 230 may be a mask used in the fabrication of integrated circuit chips on semiconductor wafers or a semiconductor wafer. The embodiments of the apparatus 200 and substrate 230 described herein, are provided to illustrate the invention and should not be used to limit the scope of the invention, and it should be understood that the invention encompasses other embodiments that would be apparent to one of ordinary skill in the art.

Generally, the electron beam apparatus 200 comprises a vacuum chamber 215 having a wall 210. The wall 210 may be constructed to hold and contain a vacuum environment 205 in the chamber 215. Optionally, a vacuum pump 202 may be used to evacuate the chamber 215 to generate and sustain a vacuum environment 205 in the chamber 215. A substrate support 220 is provided to support a substrate 230 in the chamber 215. Support motors 225 are provided to move the support 220 to precisely position the substrate 230 below the electron beams 257. For example, the support motors 225 may comprise electric motors that translate the support 220 in the x and y directions along an x-y plane parallel to the substrate surface or rotate the support 220. The apparatus 200 may further comprise position sensors 227 capable of determining the position of the support 220. For example, the position sensors 227 may reflect a light beam (not shown) from the support 220 and detect the reflected beam by interferometry to determine the support location.

The electron beam apparatus 200 further comprises a controller 270 that operates electron beam source, modulating and scanning components 285 that are arranged in electron beam columns 282 to raster scan or vector scan the electron beams 257 across the substrate 230. Raster scanning comprises periodically moving the electron beams 257 across the substrate 230 in one or more passes and modulating the intensity of the beams 257 to scan a desired pattern on the substrate 230. Vector scanning comprises moving the electron beams 257 across the substrate 230 along a path selected in accordance with the pattern to be exposed. In operation, a pattern is generated by the electron beams 257 on the substrate 230 when the controller 270 controls operation of the electron beams 257 and the support 220 to modulate and scan the electron beams 257 to expose a desired pattern on the substrate 230.

The electron beam source, modulator, and detector components 285 are capable of generating, modulating, and detecting an array of electron beams 257 in the vacuum chamber 215. The electron beams 257 are directed along electron beam pathways 284 and projected onto the substrate 230. The components 285 comprise an electron beam source component 250 to generate one or more electron beams 257 and electron beam modulator components 280 capable of modulating the electron beams 257. The electron beam source component 250 may comprise, for example, a photocathode, field emission emitter, thermionic emission emitter, negative electron affinity emission emitter, or hot electron tunneling emission emitter. In one embodiment of the electron beam exposure apparatus 200, the electron beam source components 250 create a low energy electron beam comprising an energy of about 10 keV, which is accelerated to an energy of about 50 keV to about 100 keV to expose a resist on a substrate 230 to an electron beam pattern.

Figure 3A:
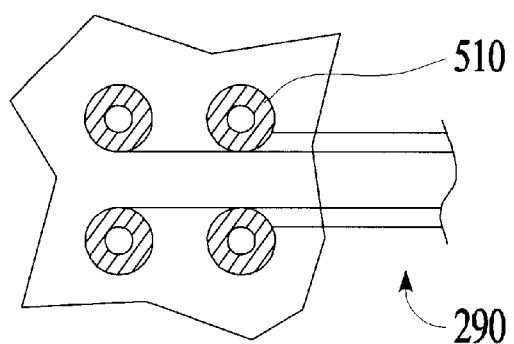
FIG. 3a is a schematic top view of an embodiment of an aperture array.

The electron beam modulator components 280 are capable of changing one or more of the intensity, shape, size, velocity, or direction of the electrons traveling through an electron beam 255. For example, the modulator components 280 may include aperture, blanking, shaping, focusing, demagnifying, accelerating, deflecting, and stigmating components. Aperturing components limit partially or fully an area through which the electron beam 255 passes to control the size or angular spread of the beam 255, or to switch the beam 255 on and off. For example, FIG. 3(a) illustrates one embodiment of an array of aperture components 510 and the electrical traces 290 extending out from each aperture component 510. The aperture components 510 are capable of controlling the intensity of the electron beams 257 that pass through the aperture components 510, for example, by blanking an electron beam 255 on or off to pulse the electron beam 255 according to a desired pulsing sequence as the beam 255 is scanned across the substrate 230. An array of aperture components 510 may also be used to define the angular spread of the beam 255. Blanking comprises switching the beam 255 on or off, such as in a two-level version of aperturing or by deflecting the beam 255 onto a beam stop. Focusing components generally shape the beam 255 to reproduce an image of the source of the beam 255. One embodiment of a focusing component is an electron lens, such as a ring to which a voltage can be applied. Demagnifying components generally shape the beam 255 to increase or decrease the size of the focused image of the source of the beam 255. Accelerating components generally change the velocity of the electrons, by increasing or decreasing their speed or changing their direction of motion. One embodiment of an accelerating component is a plate or series of plates having an applied voltage that causes it to attract the electrons. Deflecting components generally shift or bend the position of the beam 255 by a small deflection, such as to correct beam position, or a large deflection, such as to scanning the beam 255 across the substrate 230. The deflecting components may comprise, for example, electrostatic deflection plates capable of changing the electric or magnetic field coils capable of changing the magnetic field. One embodiment of a scanning component comprises a set of magnetic field coils. Stigmating components generally radially asymmetrically shape the beam 255, for example, by focusing the beam 255 differently along two orthogonal axes. In one example, stigmating is used to correct a radially asymmetrical beam to make it substantially radially symmetrical.

Figure 3B:
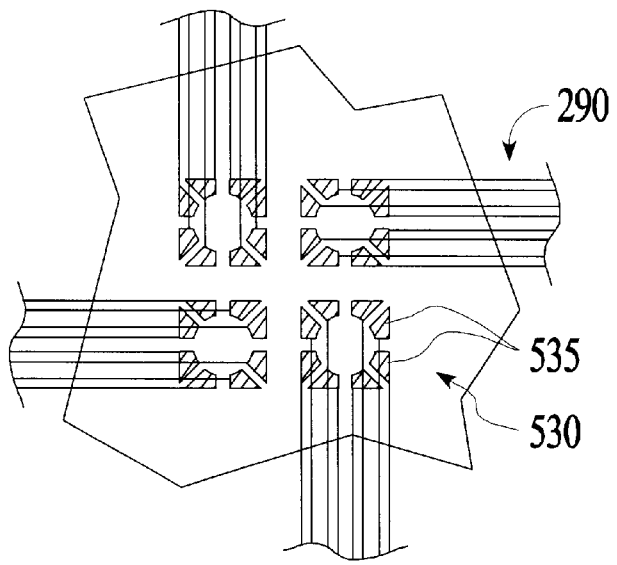
FIG. 3b is a schematic top view of an embodiment of an octupole electrode array.

The components 285 may also combine different beam modulating functions, such as an octupole element. An array of octupole elements 530 is shown in FIG. 3(b). Each octupole element 530 is capable of fine focusing, deflecting, and stigmating an electron beam 255 by an amount that is dependent upon individual voltages that can be applied to each of the eight electrodes 535. FIG. 3(b) illustrates an array of octupole elements 530 and the electrical traces 290 extending out from the octupole elements 530.

Figure 3C:
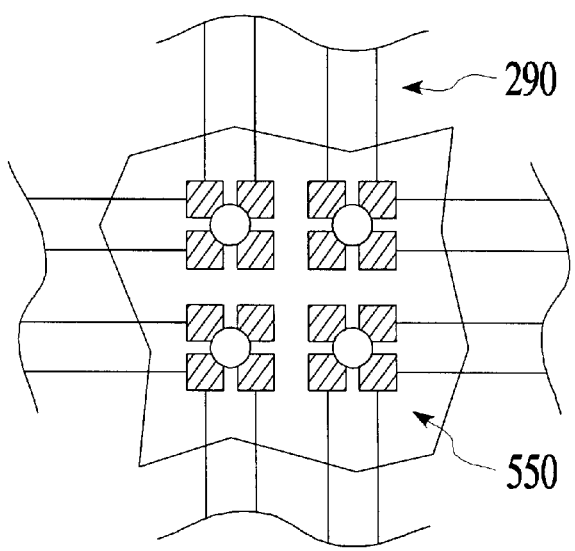
FIG. 3c is a schematic top view of a detector component array.

The components 285 further comprise electron detector components 550 to detect electrons scattered from the substrate 230. These detector components 550 may comprise, for example, one or more p-n junction diodes 243 mounted near an end of the electron beam pathways 284. The relative intensities of electrons received by the diodes 243 are related to the position of an electron beam 255 on the substrate, and may be used to form an image suitable for inspection. For example, FIG. 3(c) shows an array of solid state detector components 550 with connected electrical traces 290.

A fiducial mark locator 240 may also be used to locate fiducial marks 235 on the substrate 230. The fiducial mark locator 240 may comprise an electron detector (not shown) capable of detecting the electrons from the electron beam 257 that are back scattered from a fiducial mark 235 on the substrate 230. For example, a high energy electron beam 257 can penetrate a layer of resist to contact an underlying fiducial mark 235 to generate back scattered electrons. The fiducial mark locator 240 monitors the changes in intensity levels of the back scattered electrons to determine the actual locations of the fiducial marks 235.

In one aspect of the present invention, as shown in FIG. 2, one or more circuit boards 260 pass through a wall 210 of the chamber 215. The circuit boards 260 comprise an internal portion 350 inside the chamber 215, a wall traversing portion 360 that passes through a gap in the chamber wall 210, and optionally, an external portion 370 extending out of the chamber 215. Each circuit board 260 comprises a plurality of electrical traces 290 to connect to the components 285 to allow communication between the components 285 and external circuitry 311. One or more of the components 285 may also be mounted on the circuit boards 260. External connectors may also be attached to the terminus of the electrical traces 290 at the external portion 370 of the circuit board 260 to connect to the external circuitry 311 outside the vacuum chamber 215. While the boards 260 are shown with external portions 370 that symmetrically extend about the chamber 215, it should be understood that the circuit boards 260 may extend non-symmetrically out of the chamber 215, for example, with one side extending out of and the other side within the chamber 215.

A single circuit board 260 may be sufficient or a plurality of circuit boards 260 may be used. A number of circuit boards 260 may be used to allow for generation, modulation, scanning and detection of the electron beams 257 along the electron beam pathways 284. For example, electron beam source components 250 may be mounted on a first circuit board 260, aperture components 510 on a second circuit board 260, focusing and scanning components on a third circuit board 260, and detector components on a fourth circuit board 260. By distributing the components 285 onto a plurality of circuit boards 260, the boards 260 may be more modular or functional.

The transversely extending circuit boards 260 with the electrical traces 290 allow communication between the components 285 and the external environment while maintaining a gas-tight seal. Electrical interference signals may also be lessened by distributing the electrical traces 290 so that they are separated by a predetermined distance or in a predetermined pattern that minimizes the interaction between one signal and the electrical or magnetic fields caused by another signal. The traces 290 in a circuit board 260 may also be formed according to specific requirements such as a specific symmetry of, or distance between, two or more traces 290 to reduce cross talk between the signals carried by the individual traces 290. Furthermore, the circuit boards 260 may be easily removed or swapped out with other circuit boards 260. Also, assembly of the apparatus 200 comprising the transverse boards 260 is advantageous because it does not require fitting of large numbers of separate electrical wires through vacuum feedthroughs 160 and connecting them inside the chamber 215.

Figure 4:
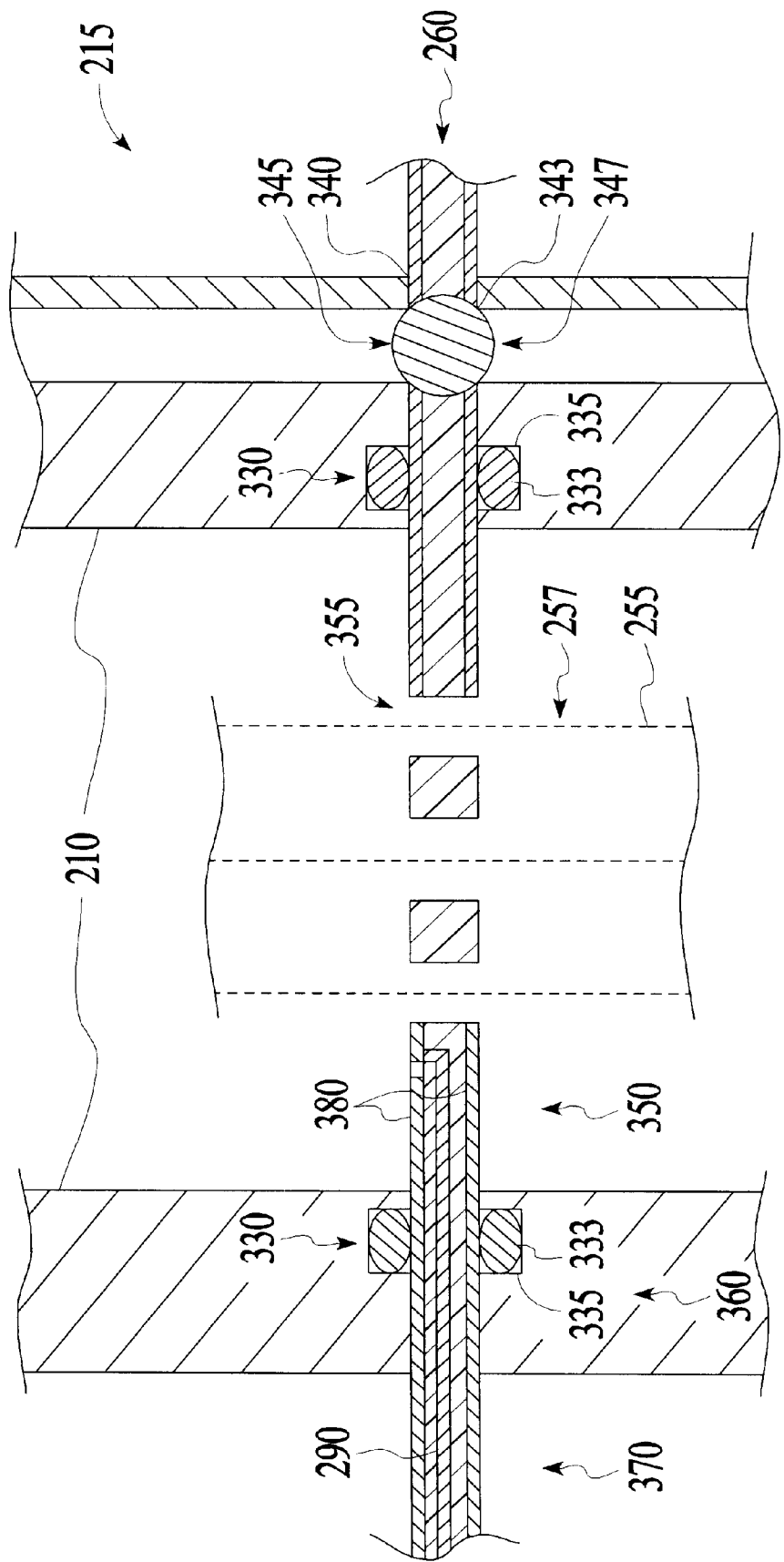
FIG. 4 is a schematic side view of an embodiment of a circuit board fitted in a chamber, showing sealing gaskets between the circuit board and the wall and features to align the circuit board in a chamber.

The electrical traces 290 of the circuit board 260 may traverse the internal 350, intermediate 360, and optional external portions 370 of the circuit board 260. The electrical traces 290 may be a pattern of interconnected electrical conducting lines, such as metal lines interconnecting sockets, holes, or pads adapted to mount the components 285 on the board 260. In one version, the electrical traces 290 are embedded in a dielectric material, such as a polymer. The electrical traces 290 may also be positioned between two outer conductor layers 380 that form a sandwich structure, as shown in FIG. 4. In this version, the outer layers 380 of the circuit board 260 may be continuous electrically conductive planes, which may be electrically grounded to shield the electron beams 257 from interference from the electrical signals passing through the electrical traces 290. The outer layers 380 may also serve to shield against cross-talk or cross-interference between the electrical signals. Additionally, the outer layers 380 may be fabricated to reduce electrostatic charge accumulation on the circuit board 260. In another version, the electrical traces 290 may be under a thick dielectric layer (not shown), such as a silicon dioxide layer.

Figure 5A:
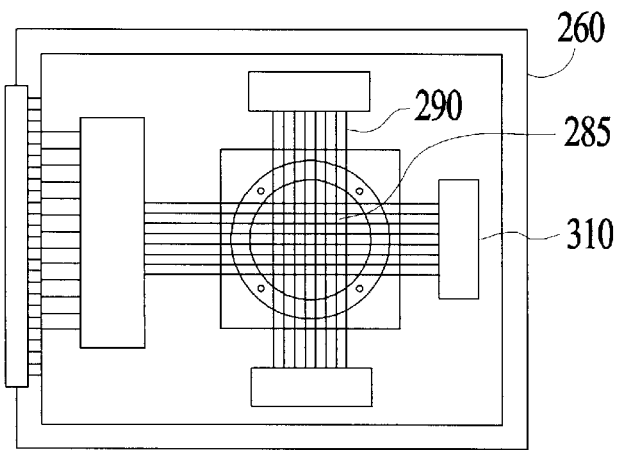
FIGS. 5a and 5b are schematic top and side views, respectively, of another embodiment of a circuit board according to the present invention.
Figure 5B:
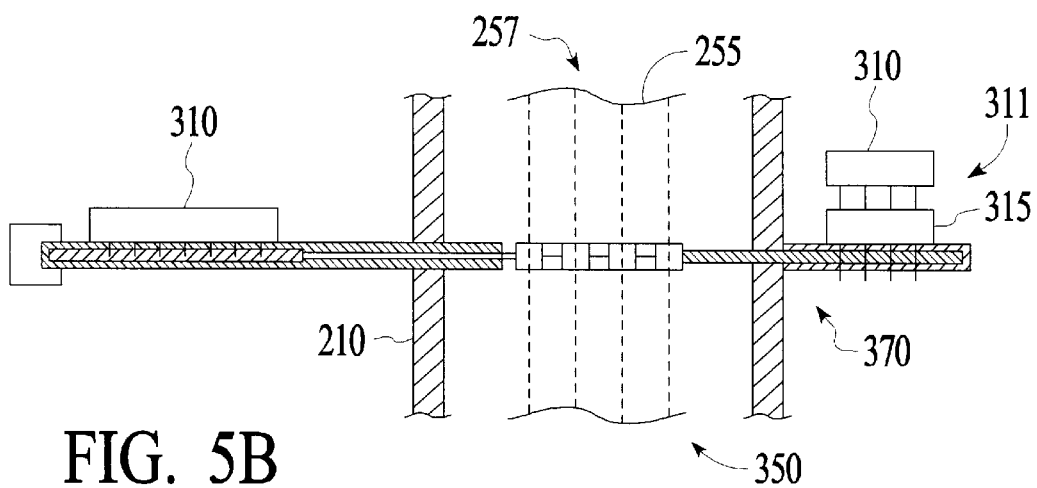

The external circuitry 311 may also include external components 310 mounted outside the chamber 215 on the external portions of the circuit boards 260, as shown in FIGS. 5(a) and 5(b). The components 285 mounted on the internal portion 350 of the circuit board 260 may be connected via the electrical traces 290 to the external components 310 on the external portion 370 of the circuit board 260. The externally mounted components 310 may include electron beam drive components, for example, digital-to-analog converters (DACs), amplifiers or digital drivers, or passive elements such as resistors and capacitors. The external components 310 may be mounted on the external portion 370 of the circuit board 260 by soldered connectors or in sockets 315 to facilitate replacement. External mounting of the electronic components 310 is advantageous because the components 310 can be replaced without disturbing the vacuum environment in the chamber 215. This embodiment is useful if the external components 310 need to be exchanged or replaced often. Also, the external components 310 may be those components that would otherwise cause interference with the electron beams 257, such as components that involve high-voltage or high-current signals.

The external components 310 may also include heat sinks to allow easier dissipation of heat for heat-generating components.

In one version, as illustrated in FIG. 4, one or more gas-tight seals are formed at the interface between the circuit boards 260 and the walls 210 of the chamber 215 to seal out the external environment by placing a sealing gasket 330 between the circuit board 260 and a chamber wall 210. The gas-tight seal between the two environments reduces leakage of air or gas between the two environments to maintain a vacuum environment in the chamber. In this version, the surface of the circuit board 260 is a smooth surface to provide a receiving surface for a sealing gasket 330 comprising an O-ring 333 that is also sized to fit into a matching groove 335 in the wall of the chamber 215. Suitable sealing O-rings 333 may comprise elastomer material such as fluoroelastomer, for example, Viton (TM, Du Pont, Wilmington, Del.). The O-ring 333 is positioned on the board 260 at the wall traversing portion 360 separating the internal components 285 from the external components 310 on the board 260 and about a circular opening 355 through which the array of electron beams 257 travels toward the substrate 230. The electrical traces 290 extend radially outward from the inner circular region of the board 260. Thus, the circuit board 260 may be sandwiched between the O-rings 333 that seal by fitting into corresponding O-ring grooves 335 positioned in the chamber walls 210. The O-rings 333 may also be brazed or soldered onto the circuit board 260. Where the chamber 215 is maintained at a high vacuum, the sealing gaskets 330 may also be a metal gasket or a deformable ring coated with soft metal, such as indium.

The circuit boards 260 and their associated components 285 should also be aligned accurately in the chamber 215 and with one another along the electron beam pathways 284, and with the support 220 in the chamber 215 to allow the electron beams 257 to register on the correct locations on the substrate 230, as, for example, illustrated in FIG. 4. In one version, the circuit boards 260 and the chamber walls 210 comprise complementary features, such as a protrusion 345 and matching cavity 347, that are sized to fit into one another to align the circuit boards 260 within the chamber 215. For example, suitable features may be a ball 340 resting in a recess in the circuit board 260 and that fits into a matching countersunk recess 343 in the wall 210 of the chamber 215. In operation, the chamber wall 210 is pressed onto the board 260 by tightening screws (not shown) passing through the board 260 thereby compressing the ball 340 into the sides of the matching countersunk recess 343 to provide a precise alignment. As another example, cylindrical or tapered pins (not shown) may be used to align the board 260 to matching holes in the chamber wall 210.

Figure 6:
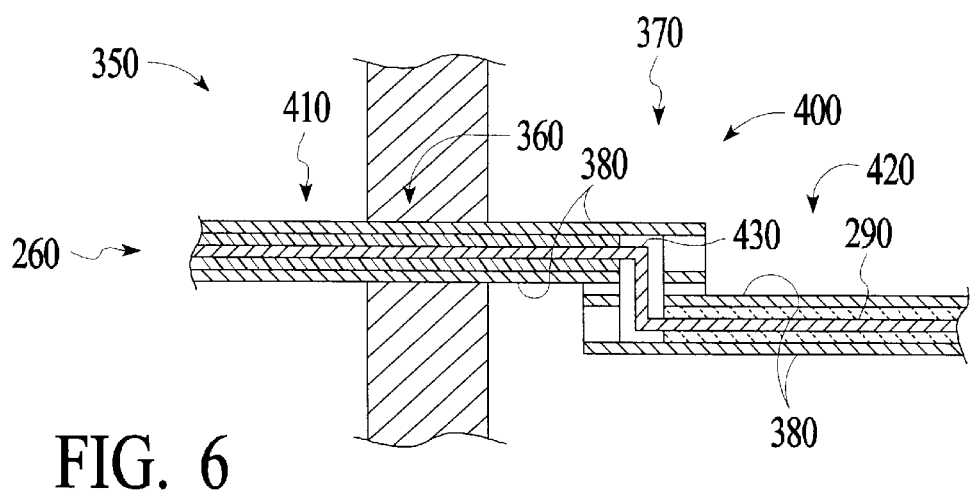
FIG. 6 is a schematic side view of an embodiment of a circuit board comprising first and second portions.

In one version, as illustrated in FIG. 6, the circuit board 260 comprises a composite structure 400 comprising an internal portion 410 that is a sub-board composed of a first material and an external portion 420 that is a sub-board composed of a second material. The internal portion 410 is substantially internal to the chamber 215 and may comprise a first material suitable for the internal conditions, whereas the external portion 420 is substantially external to the chamber 215 and may comprise a second material suitable for the external conditions. Thus, the first material may be chosen to provide good integrity in a vacuum environment, for example, by exhibiting reduced outgassing or the ability to withstand high temperatures. For example, the first material may comprise a heat resistant material, for example, a ceramic that is capable of withstanding temperatures in excess of 500° C. The ceramic material may also be chosen to provide a relatively high current leakage to minimize surface charging in or near the holes in the circuit boards 260 through which the electron beams 257 pass. Suitable ceramic materials include aluminum oxide or silicon dioxide. The second material may be a material that is easily or inexpensively fabricated into a circuit board 260, such as a composite of fiberglass and polymer, for example, fiberglass embedded in an epoxy matrix. The internal components 285 are mounted on the first portion 410, and the external components and the sealing region may be mounted on the second portion 420 made of a different material. Also, the internal portion 410 may be connected to the external portion 420, such as by vias 430, solder pads, or board mounting connectors.

The number of electrical traces 290 passing through the chamber walls 210 may also be reduced by encoding input or output data signals. Various embodiments of encoding are multiplexing, such as time division multiplexing, and various forms of data compression. In one version, data signals going into the chamber 215 are encoded by one or more encoders comprising external circuitry outside of the chamber 215 and decoded by one or more decoders comprising internal circuitry inside of the chamber 215. Conversely, data signals going out from the chamber 215 are encoded by one or more encoders inside of the chamber 215, and decoded by one or more decoders outside of the chamber 215. Inside the chamber 215, connectors attached to decoders may transmit decoded signals to the components 285. Conversely, connectors attached to encoders in the chamber 215 may transmit signals to be encoded by the components 285. In two embodiments, the encoders and decoders comprise multiplexers and demultiplexers, respectively, or data compressors and decompressors, respectively.

Although the present invention has been described in considerable detail with regard to certain preferred versions thereof, other versions are possible. For example, the present invention could be used with other pattern exposure devices, such as an apparatus that records a pattern using positive ions. Thus, the appended claims should not be limited to the description of the preferred versions contained herein.

What is claimed is:

1. An electron beam apparatus to register an electron beam pattern on a substrate, the apparatus comprising:
   a vacuum chamber having a wall;
   a substrate support in the vacuum chamber;
   electron beam source components to generate an array of electron beams in the vacuum chamber;
   electron beam modulator components to modulate the electron beams in the vacuum chamber;
   electron beam detector components to detect the electron beams in the vacuum chamber;
   one or more circuit boards passing through the wall of the vacuum chamber, each circuit board comprising (i) an internal portion to support one or more of the electron beam source, modulator or detector components, (ii) an external portion outside the vacuum chamber to support one or more external components, and (iii) a plurality of electrical traces that extend from the internal portion to the external portion to electrically connect the electron beam source, modulator or detector components to the external components; and
   one or more of the external components mounted on the external portions of the circuit boards.

2. An apparatus according to claim 1 further comprising a sealing gasket between each circuit board and the wall of the vacuum chamber.

3. An apparatus according to claim 1 wherein each circuit board comprises a feature that may be fitted to a corresponding feature of the chamber wall to align the circuit board in the vacuum chamber.

4. An apparatus according to claim 1 wherein the electron beam modulator components comprise an array of beam blanking components.

5. An apparatus according to claim 1 wherein the internal portion comprises a first structure and the external portion comprises a second structure, the first structure comprising a different material than the second structure.

6. An apparatus according to claim 5 wherein the first structure comprises a ceramic and the second structure comprises a composite of fiberglass and polymer.

7. An apparatus according to claim 1 further comprising external circuitry capable of encoding an electrical data signal passed through the electrical traces in the circuit boards.

8. An apparatus according to claim 7 wherein the encoding comprises digital multiplexing.

9. An electron beam apparatus to register an electron beam pattern on a substrate, the apparatus comprising:
   a vacuum chamber having a wall with a first feature;
   a substrate support in the vacuum chamber;

electron beam source components to generate an array of electron beams in the vacuum chamber;

electron beam modulator components to modulate the electron beams in the vacuum chamber;

electron beam detector components to detect the electron beams in the vacuum chamber;

one or more circuit boards passing through the wall of the vacuum chamber, each circuit board comprising (i) an internal portion to support one or more of the electron beam source, modulator or detector components, (ii) an external portion outside the vacuum chamber to support one or more external components, (iii) a plurality of electrical traces that extend from the internal portion to the external portion to electrically connect the electron beam source, modulator or detector components to the external components, and (iv) a second feature that may be fitted to the first feature in the chamber wall to align the circuit board in the vacuum chamber; and one or more of the external components mounted on the external portions of the circuit boards.

10. An apparatus according to claim 9 wherein the first feature comprises a protrusion and the second feature comprises a cavity, or vice versa.

11. An apparatus according to claim 10 wherein the protrusion comprises a ball and the cavity comprises a recess sized to accommodate the ball.

12. An apparatus according to claim 9 comprising a sealing gasket between the circuit board and the wall of the vacuum chamber.

13. An apparatus according to claim 9 further comprising external circuitry capable of encoding an electrical data signal passed through the electrical traces in the circuit board.

14. An apparatus according to claim 9 wherein the internal portion comprises a first structure and the external portion comprises a second structure, the first structure comprising a different material than the second structure.

15. An electron beam apparatus to register an electron beam pattern on a substrate, the apparatus comprising:

a vacuum chamber having a wall;

a substrate support in the vacuum chamber;

electron beam source components to generate an array of electron beams in the vacuum chamber;

electron beam modulator components to modulate the electron beams in the vacuum chamber, the electron beam modulator components comprising an array of beam blanking components;

electron beam detector components to detect the electron beams in the vacuum chamber; and a circuit board passing through the wall of the vacuum chamber, the circuit board comprising (i) an internal portion to support the array of beam blanking components, (ii) an external portion outside the vacuum chamber, and (iii) a plurality of electrical traces that extend from the internal portion to the external portion.

16. An apparatus according to claim 15 further comprising one or more of the external components mounted on the external portion of the circuit board.

17. An apparatus according to claim 15 further comprising additional circuit boards to support one or more of the electron beam source, modulator or detector components.

18. An apparatus according to claim 15 further comprising a sealing gasket between each circuit board and chamber wall.

19. An apparatus according to claim 15 wherein each circuit board comprises a feature that may be fitted to a corresponding feature of the wall of the vacuum chamber to align the circuit board in the vacuum chamber.

20. An apparatus according to claim 15 wherein the internal portion comprises a first structure and the external portion comprises a second structure, the first structure comprising a different material than the second structure.

21. An apparatus according to claim 15 further comprising external circuitry capable of encoding an electrical data signal passed through the electrical traces in the circuit boards.

* * * * *